United States Patent
Terai et al.

(10) Patent No.: US 11,460,765 B2
(45) Date of Patent: Oct. 4, 2022

(54) EXPOSURE METHOD, EXPOSURE APPARATUS, AND SEMICONDUCTOR DEVICE MANUFACTURING METHOD

(71) Applicant: Kioxia Corporation, Tokyo (JP)

(72) Inventors: Hayato Terai, Mie (JP); Manabu Takakuwa, Tsu (JP)

(73) Assignee: Kioxia Corporation, Tokyo (JP)

( * ) Notice: Subject to any disclaimer, the term of this patent is extended or adjusted under 35 U.S.C. 154(b) by 232 days.

(21) Appl. No.: 17/010,040

(22) Filed: Sep. 2, 2020

(65) Prior Publication Data

US 2021/0294205 A1   Sep. 23, 2021

(30) Foreign Application Priority Data

Mar. 19, 2020  (JP) .............................. JP2020-050121

(51) Int. Cl.
G03F 7/20 (2006.01)
G03F 1/42 (2012.01)
H01L 21/027 (2006.01)
H01L 21/66 (2006.01)

(52) U.S. Cl.
CPC .............. *G03F 1/42* (2013.01); *G03F 7/7055* (2013.01); *H01L 21/0274* (2013.01); *H01L 22/20* (2013.01)

(58) Field of Classification Search
CPC ...... G03F 1/42; G03F 7/7055; G03F 7/70783; G03F 9/7003; G03F 9/7026; G03F 7/7085; G03F 7/70775; H01L 21/0274; H01L 22/20; H01L 21/0271
See application file for complete search history.

(56) References Cited

U.S. PATENT DOCUMENTS 9,625,831 B1 * 4/2017 Segawa ................ H01L 21/682

FOREIGN PATENT DOCUMENTS

| JP | 2000-328297 A | 11/2000 |
| JP | 2001-102288 A | 4/2001 |
| JP | 2002-231616 A | 8/2002 |

* cited by examiner

*Primary Examiner* — Mesfin T Asfaw
(74) *Attorney, Agent, or Firm* — Oblon, McClelland, Maier & Neustadt, L.L.P.

(57) ABSTRACT

An exposure method includes acquiring first height information through detection of a height of an upper surface of a substrate subjected to exposure; acquiring first position information through detection of a relative position between the substrate and a first mask having a first pattern to be transferred on the substrate; converting the first height information to second position information; acquiring second height information through detection of a height of the upper surface of the substrate; acquiring third position information through detection of a relative position between the substrate and a second mask having a second pattern to be transferred on the substrate; converting the second height information to fourth position information; calculating differential position information, based on difference between the second position information and the fourth position information; and aligning the second mask and the substrate, based on the third position information and the differential position information.

18 Claims, 8 Drawing Sheets

FIG.7A
SHIFT $k_1$
MAGNIFICATION $k_3$
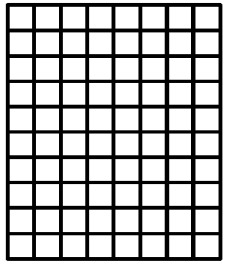
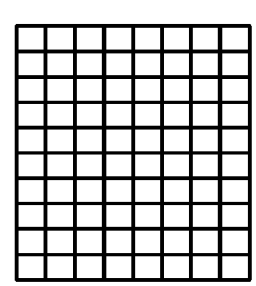
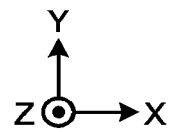
ROTATION OR ORTHOGONALITY $k_5$
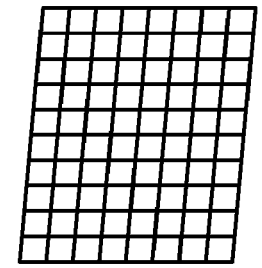
FIG.7B
SHIFT $k_2$
MAGNIFICATION $k_4$
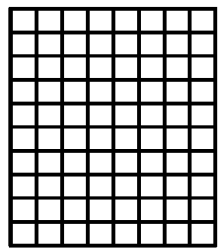
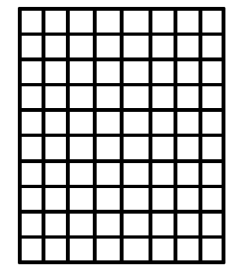
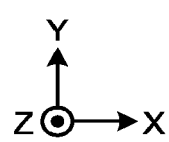
ROTATION OR ORTHOGONALITY $k_6$
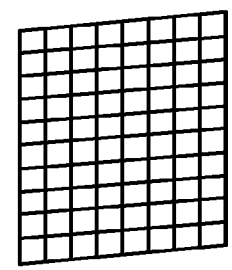

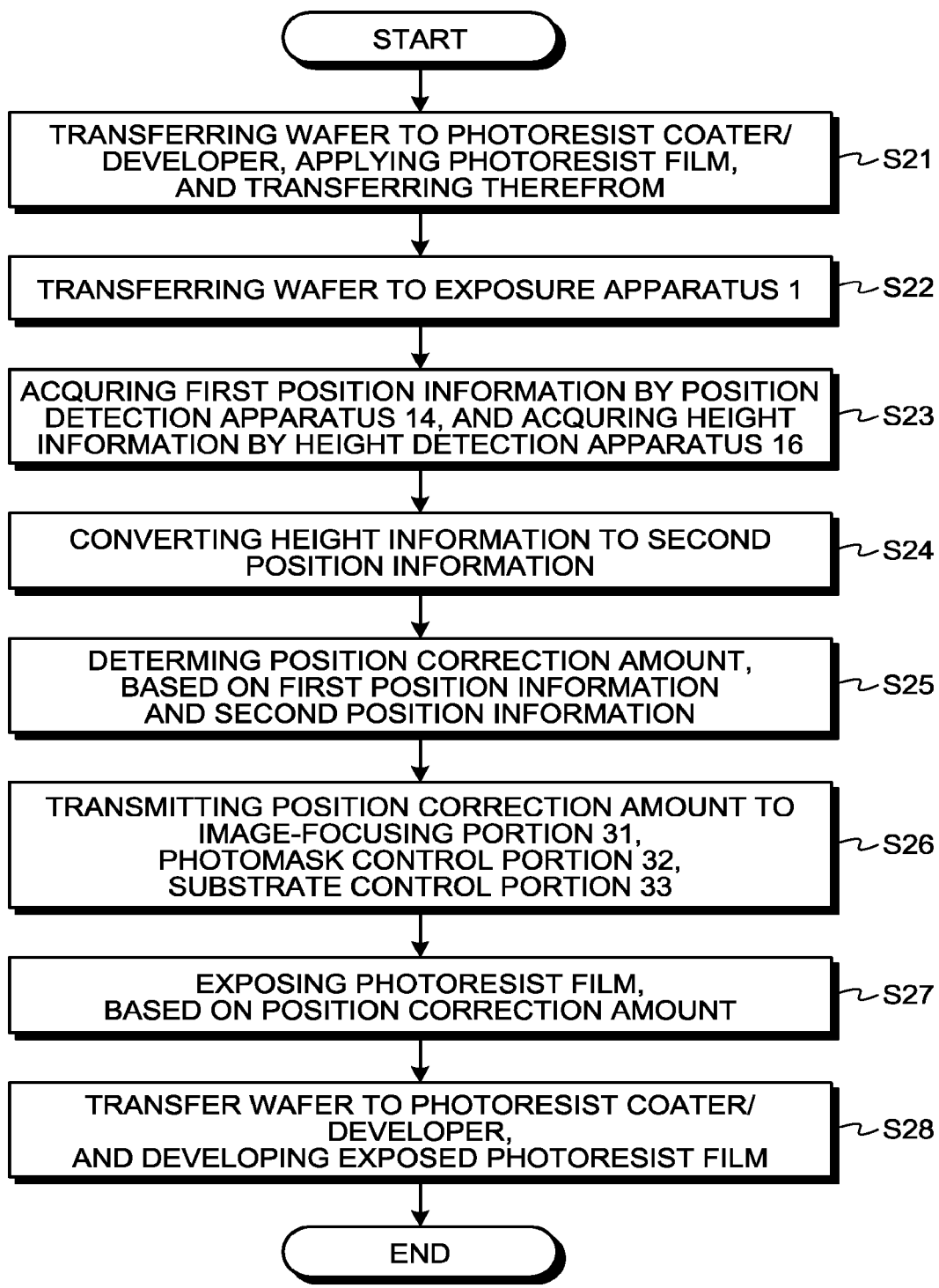

EXPOSURE METHOD, EXPOSURE APPARATUS, AND SEMICONDUCTOR DEVICE MANUFACTURING METHOD

CROSS-REFERENCE TO RELATED APPLICATIONS

This application is based upon and claims the benefit of priority from Japanese Patent Application No. 2020-050121, filed on Mar. 19, 2020; the entire contents of which are incorporated herein by reference.

FIELD

Embodiments of the present disclosure relate to an exposure method, an exposure apparatus, and a semiconductor device manufacturing method.

BACKGROUND

In an exposure apparatus, patterns of an original plate are projected onto a photoresist layer formed on a substrate by a predetermined optical system, and thus the photoresist layer is exposed. Before the patterns of the original plate are projected, a position of an upper surface of the substrate in a vertical direction is measured by a height detection apparatus, and, based on a measurement result, a relative position between the optical system and the upper surface of the substrate is controlled.

BRIEF DESCRIPTION OF DRAWINGS

FIGS. 7A and 7B are views illustrating a positional deviation correctable by parameters of exposure conditions; and FIG. 8 is a flowchart illustrating an exposure method according to modification of the embodiment.

DETAILED DESCRIPTION

Figure 1:
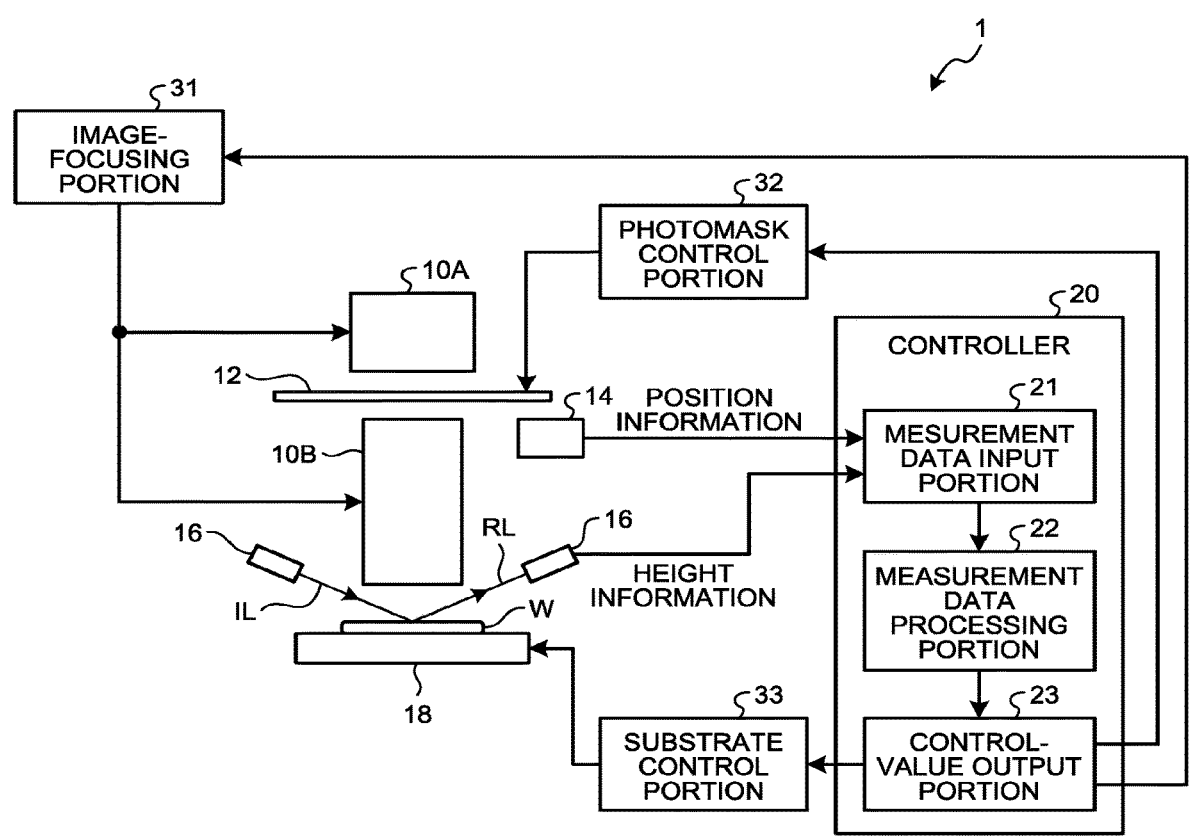
FIG. 1 is a block diagram schematically illustrating a configuration example of an exposure apparatus according to one embodiment.

In a semiconductor device such as a semiconductor memory, a feature size is decreasing along with an increased degree of integration, and height differences in a vertical direction are also increasing. Under such situations, an improved vertical resolution of the height detection apparatus has been expected in order to ensure a positional accuracy in the vertical direction.

Additionally, a two dimensional relative position between the patterns of the original plate and the substrate is measured by a position detection apparatus, and, based on the measurement result, the patterns are aligned with the substrate. The measurement of such a relative position is performed mainly by detecting alignment marks provided respectively on the original plate and the substrate. However, not only the alignment marks are detected but also a correction may be made on the detection result of the alignment marks. Especially under the situations of the increased degree of integration, such correction is frequently performed in alignment process.

One embodiment of this disclosure provides an exposure method, an exposure apparatus, and a semiconductor device manufacturing method that are capable of employing, for positional correction, information relating to a height of an upper surface of the substrate, the information being obtained by a height detection portion.

According to one embodiment of this disclosure, an exposure method is provided. The exposure method includes acquiring first height information through detection of a height of an upper surface of a substrate subjected to exposure; acquiring first position information through detection of a relative position between the substrate and a first mask having a first pattern to be transferred on the substrate; converting the first height information to second position information; acquiring second height information through detection of a height of the upper surface of the substrate; acquiring third position information through detection of a relative position between the substrate and a second mask having a second pattern to be transferred on the substrate; converting the second height information to fourth position information; calculating differential position information, based on difference between the second position information and the fourth position information; and aligning the second mask and the substrate, based on the third position information and the differential position information.

Non-limiting, exemplary embodiments of the present disclosure will now be described with reference to the accompanying drawings. In the drawings, the same or corresponding reference marks are given to the same or corresponding members or components, and redundant explanations will be omitted. It is to be noted that the drawings are illustrative of the disclosure, and there is no intention to indicate scale or relative proportions among the members or components. Therefore, the specific size should be determined by a person having ordinary skill in the art in view of the following non-limiting embodiments.

First, referring to FIG. 1, explanation is made on an exposure apparatus according to one embodiment. FIG. 1 is a block diagram schematically illustrating the exposure apparatus according to the embodiment. As illustrated, an exposure apparatus 1 has an illumination system 10A, a lens system 10B, a position detection apparatus 14, a height detection apparatus 16, and a stage 18. Additionally, the exposure apparatus 1 is provided with a supporting portion (not illustrated) configured to support a reticle 12 (also referred to as a photomask or an original plate), which is replaceable depending on devices to be manufactured.

The illumination system 10A may include a light source, an optical system, and a slit plate, although not illustrated. The light source is configured to emit exposure light. The optical system may include one or plural lenses and convert the exposure light from the light source to collimated exposure light. The slit plate may have an exposure slit configured to shape the collimated exposure light to a slit-shaped light beam.

The lens system 10B projects an image, which is created when the slit-shaped light passes through the reticle 12, onto the wafer W. The lens system 10B includes one or plural lenses so that a magnitude of the image to be projected may be changed.

The position detection apparatus 14 detects an alignment mark provide in the reticle 12 and an alignment mark provided on a wafer W serving as a substrate onto which patterns of the reticle 12 are to be transferred; generates position information based on the detection results; and transmits the position information to a controller 20.

The height detection apparatus 16 emits an emission light IL toward the wafer W on the stage 18, receives a reflection light RL reflected from an upper surface (on which a semiconductor device is to be manufactured) of the wafer W, and thus detects a height of the upper surface of the wafer W. Height information is generated based on the detection results, and the generated height information is transmitted to the controller 20. Incidentally, in this embodiment, a focus area of the height detection apparatus 16 may be, for example, 0.1 to 1 mm by 0.1 to 1 mm. Namely, the height detection apparatus 16 has a resolution corresponding to such a focus area.

The stage 18 has an upper surface on which the wafer W is placed. The upper surface is provided with a wafer chuck mechanism. The wafer chuck mechanism may be realized by a vacuum chuck, which holds the wafer W by vacuuming the wafer W, or an electrostatic chuck, which holds the wafer W by Coulomb force.

The controller 20 comprehensively controls the exposure apparatus 1. The controller 20 has a measurement data input portion 21, a measurement data processing portion 22, and a control-value output portion 23. The measurement data input portion 21 receives the position information transmitted from the position detection apparatus 14, and the height information transmitted from the height detection apparatus 16. The position information and the height information that are received by the measurement data input portion 21 are then transmitted to the measurement data processing portion 22. Upon reception of the position information and the height information from the measurement data input portion 21, the measurement data processing portion 22 performs various arithmetic processes on the position information and the height information, and then calculates a position correction amount. A control-value based on the position correction amount is transmitted from the control-value output portion 23 to an image-focusing portion 31, a photomask control portion 32, and the substrate control portion 33.

Additionally, the controller 20 is configured as a computer including a central processing unit (CPU), a read only memory (ROM), a random access memory (RAM), and the like. Alternatively, the controller 20 may be configured by a processor including hardware, such as an application specified integrated circuit (ASIC), a programmable gate array (PGA), or a field programmable gate array (FPGA). The computer and processor cause the exposure apparatus 1 to perform an exposure method described later, in accordance with a predetermined computer program and various kinds of data. The computer program and the data may be stored in a predetermined storage device and input to the controller 20. Alternatively, the computer program and data may be stored in a non-transitory computer readable medium such as a hard disk drive (HDD), a server, or a semiconductor memory, and downloaded to the controller 20 wirelessly or with wire therefrom.

Figure 2:
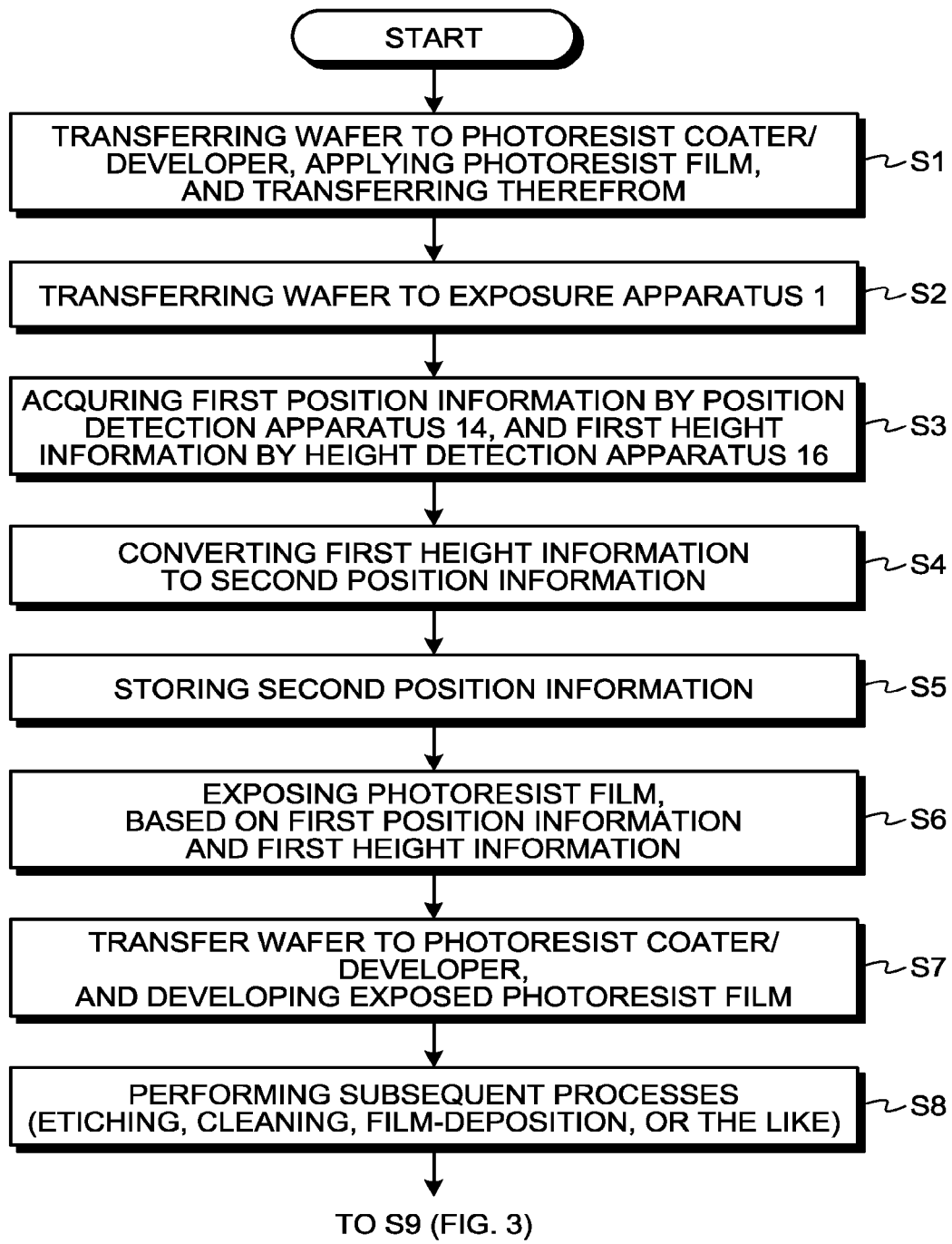
FIG. 2 is a flowchart illustrating an exposure method according to one embodiment.
Figure 3:
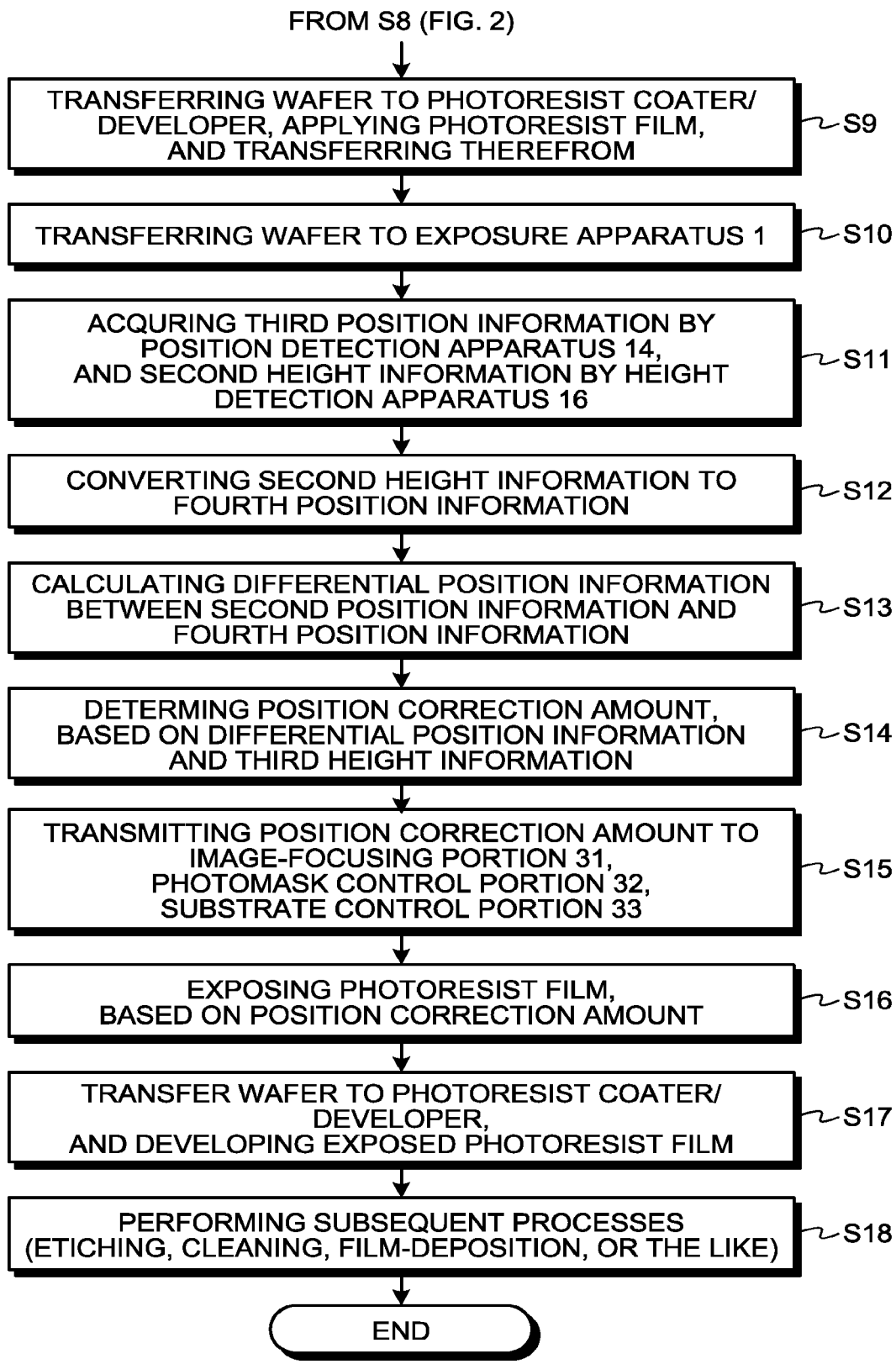
FIG. 3 is a flowchart illustrating the exposure method according to the embodiment, continued from FIG. 2.

In the following, referring to FIG. 2 and FIG. 3, explanation is made on an exposure method according to one embodiment. FIG. 2 and FIG. 3 are flowcharts illustrating the exposure method according to the embodiment. The exposure method according to the embodiment is performed using the exposure apparatus 1 of FIG. 1, and each part of the exposure apparatus 1 is controlled by instruction signals from the controller 20.

First, the wafer W as a pattern-transfer target is prepared. It is assumed here that a base layer and various thin films on the base layer are formed on the wafer W. The thin films are formed of an insulating material or an electrically conductive material, and may be patterned to have a predetermined circuit patterns. The base layer may be formed of the insulating material, or silicon.

At Step S1, the wafer W is transferred into a photoresist coater/developer (not illustrated) provided outside of the exposure apparatus 1, and here a photoresist film is coated onto the wafer W.

The wafer W having the photoresist film coated thereon is transferred into the exposure apparatus 1 from the photoresist coater/developer (Step S2). The transferring of the wafer W may performed through a loader provided between the photoresist coater/developer and the exposure apparatus 1. Inside the exposure apparatus 1, the wafer W is placed on the stage 18 by a predetermined transferring mechanism (not illustrated). The wafer W placed on the stage 18 is held onto the upper surface of the stage 18 by the wafer chuck mechanism.

Subsequently, at Step S3, the wafer W is scanned in an x-y plane by movement of the stage 18. During this scanning, a height with respect to a predetermined reference surface (for example, an upper surface of the base layer of the wafer W) is detected through the photoresist film at each coordinate point (x, y) on the upper surface of the wafer W by the height detection apparatus 16. Based on the detection result, first height information is acquired. The first height information may be, for example, data that associate each coordinate point with a height therein. The first height information is transmitted to the measurement data input portion 21 (FIG. 1) of the controller 20 from the height detection apparatus 16.

Additionally, at Step S3, the position detection apparatus 14 detects the alignment mark (not illustrated) of the reticle 12 and the alignment mark (not illustrated) of the wafer W held by the stage 18, and thus acquires first position information based on the detection result. The first position information is transmitted to the measurement data input portion (FIG. 1) of the controller 20 from the position detection apparatus 14.

Next, at Step S4, the first height information is converted to second position information in the measurement date processing portion 22. This conversion may be performed, for example, by differentiating a height function to x with respect to an x-axis and a height function to y with respect to a y-axis. The second position information is stored in the storage device included in the controller 20 (Step S5). However, the second position information may be stored in a peripheral storage device connected to the controller 20. The second position information will be used at Step S13 (FIG. 3) described later.

Then, at Step S6, the photoresist film is exposed based on the first position information acquired by the position detection apparatus 14 and the first height information acquired by the height detection apparatus 16.

Figure 4:
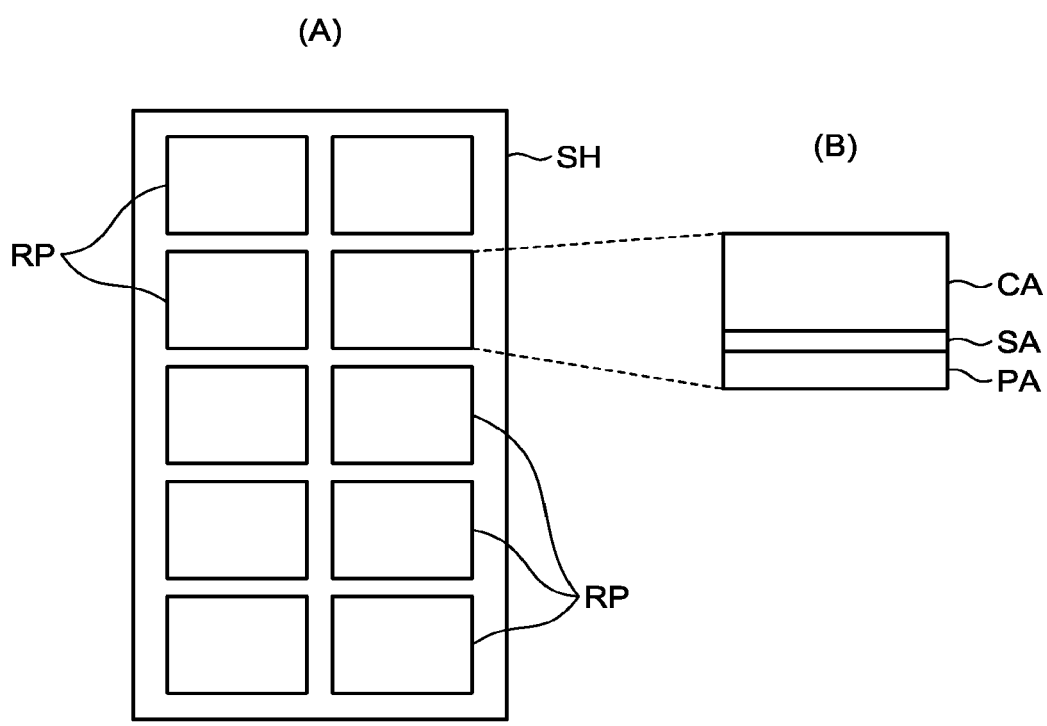
FIG. 4 is a plan view illustrating an example of a shot region of a reticle usable in the exposure apparatus of FIG. 1 in the exposure method according to the embodiment.

Here, in this exposure, the reticle 12 (FIG. 1) having a shot region illustrated in FIGS. 4A and 4B may be used. Referring to a part (A) of FIG. 4, a shot region SH has plural (ten in an illustrated example) chip regions RP. Each one of the chip regions RP corresponds to one semiconductor chip. As illustrated in a part (B) of FIG. 4, each chip region RP has, for example but not limited to, a memory cell area CA (referred simply to as a cell area CA, hereinafter), a peripheral circuit area PA (referred simply to as a peripheral area PA, hereinafter), and a sense amplifier area SA (referred simply to as an S/A area SA, hereinafter). The cell area CA, the peripheral area PA, and the S/A area SA have respective patterns to be transferred. Moreover, plural reticles 12, which have predetermined patterns to be transferred in corresponding areas of the cell area CA, the peripheral area PA, and the S/A area SA, are prepared at each exposure process.

For example, a semiconductor device manufactured by using the reticle 12 having such a shot region may be a semiconductor storage device having a three-dimensional structure. In this case, the cell area on the wafer may include a stacked body where insulating layers and conductive layers are alternately stacked one on the other, and plural memory cells arranged in semiconductor pillars penetrating through the stacked body. On the other hand, such a stacked body is not formed in a peripheral area in the wafer, which corresponds to the peripheral area PA, and in an S/A area in the wafer, which corresponds to the S/A area SA. Therefore, a relatively large height difference may be formed between the cell area and the peripheral and S/A area. Incidentally, in the following explanation, the cell area in the wafer may also be referred to as the cell area CA. Similarly, the peripheral area in the wafer may be referred to as the peripheral area PA; and the S/A area in the wafer may be referred to as the S/A area SA.

Additionally, one or more alignment marks may be provided within the shot region SH. The alignment mark(s) may include an alignment mark to be used for positional alignment in y-axis directions (lengthwise directions of the shot region SH in FIG. 4) of the shot region SH and another alignment mark to be used for positional alignment in x-axis directions (breadthwise directions of the shot region SH in FIG. 4) of the shot region SH.

Next, at Step S7, the wafer W of which photoresist film is exposed is transferred out from the exposure apparatus 1 to a photoresist coater/developer, where the photoresist film is then developed. With this, a predetermined photoresist mask is formed on the upper surface of the wafer W.

Then, at Step S8, predetermined various processes are performed on the wafer W of which upper surface has the photoresist mask formed, and thus a predetermined circuit pattern is formed on the wafer W. These processes may include an etching process using the photoresist mask, a cleaning process, a film deposition process, and the like.

After the predetermined various processes are completed, the wafer W is transferred back to the resist coat/developer, where a photoresist film is formed on the upper surface of the wafer W (Step S9). The wafer W on which the photoresist film is formed is transferred into the exposure apparatus 1 (Step S10).

Subsequently, at Step S11, the wafer W is scanned in the x-y plane by movement of the stage 18. During this scanning, a height with respect to a predetermined reference surface (for example, the upper surface of the base layer of the wafer W) is detected through the photoresist film at each coordinate point (x, y) on the upper surface of the wafer W by the height detection apparatus 16. Based on the detection result, second height information is acquired. The second height information may be, for example, data that associate each coordinate point with a height therein. The second height information is transmitted to the measurement data input portion 21 (FIG. 1) of the controller 20 from the height detection apparatus 16.

Additionally, at Step S11, the position detection apparatus 14 detects an alignment mark (not illustrated) of the reticle 12 and an alignment mark (not illustrated) of the wafer W held by the stage 18. Based on the detection results, third position information is acquired. The reticle 12 here has the cell area CA, the peripheral area PA, and the S/A area SA, similarly with the reticle 12 used at Step S3, while patterns to be transferred within the regions CA, PA, SA are different in the reticle 12 used in Step S11 from in the reticle 12 used in Step S3. The reticle 12 used in Step S11 has the patterns to be transferred on the photoresist film at Step S16 described later. Incidentally, the acquired third position information is transmitted from the position detection apparatus 14 to the measurement data input portion 21 (FIG. 1) of the controller 20.

Next, at Step S12, the second height information is converted into fourth position information in the measurement data processing portion 22. This conversion may also be performed by differentiating a height function to x with respect to the x-axis and a height function to y with respect to the y-axis.

Subsequently, at Step S13, based on both the second position information, which has been converted at Step S4 from the first height information and stored at Step S5, and the fourth position information, which has been converted at Step S12 from the second height information, position difference information is calculated in the measurement data processing portion 22.

Figure 5A:
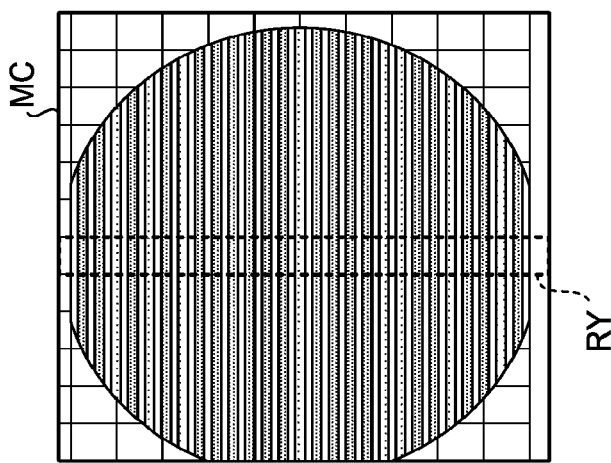
FIGS. 5A through 5E are explanatory views explaining a differential position information calculated in a measurement data processing portion of the exposure apparatus of FIG. 1.
Figure 5B:
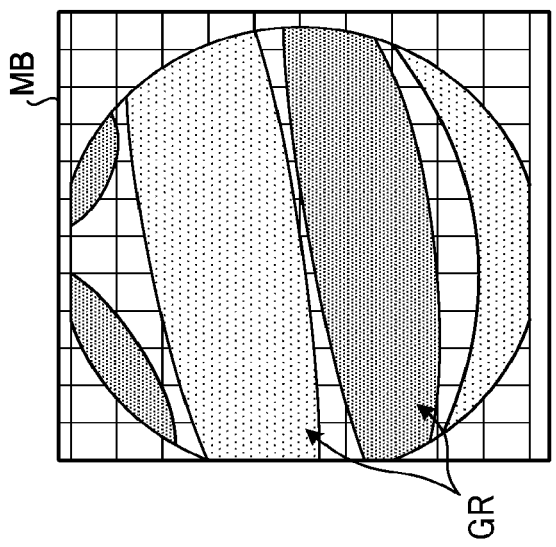
Figure 5C:
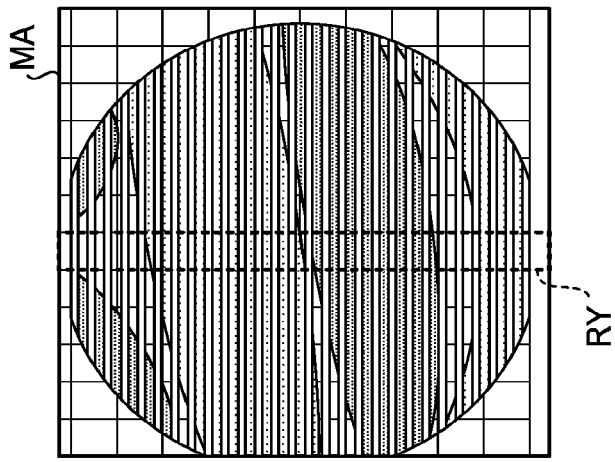
Figure 5D:
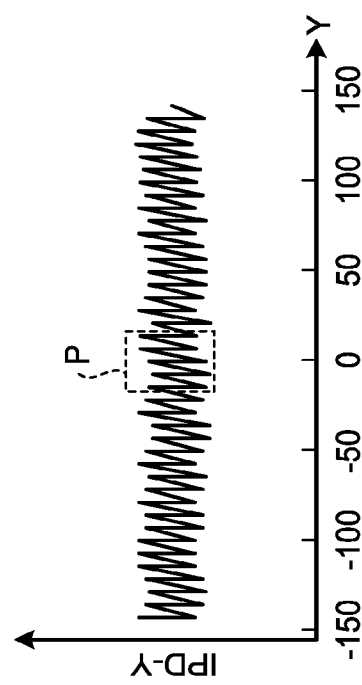
Figure 5E:
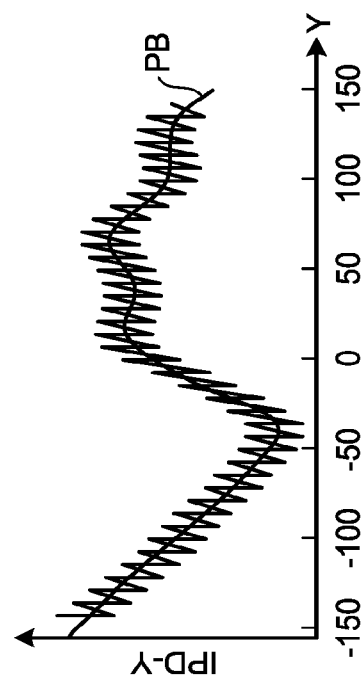

FIGS. 5A through 5E are explanatory views for explaining the position difference information calculated in the measurement data processing portion 22. FIG. 5A illustrates a (unprocessed) difference value map MA that indicates a difference value in each coordinate point, the difference value being obtained by taking a difference value between the second position information and the fourth position information in each coordinate point on the surface of the wafer W. FIG. 5B illustrates a warpage component map MB that indicates a component that stems from warpage of the wafer W and is included in the difference value map MA. FIG. 5C is a net (or a residual) difference value MC where the warpage component is eliminated from the difference value map MA. FIG. 5D is a graph obtained by plotting with respect to the y-axis the difference value in an elongated area RY along the y direction. FIG. 5E is a graph obtained by plotting with respect to the y-axis a value of the residual difference value map MC along the y direction.

Because the wafer W is warped entirely or locally due to stress applied within the wafer W, the first height information and the second height information that are acquired by the height detection apparatus 16 have the warpage component of the warped wafer W. Because of this, the second position information converted from the first height information, and the fourth position information converted from the second height information also include the warpage component. Such a warpage component is expressed by gradation (or hatching in gray scale) GR in FIG. 5B, and by pulse beat PB in FIG. 5D. The warpage component expressed in FIG. 5B may be measured by, for example, a stylus type or a noncontact warpage measurement apparatus, an X-ray topography, or the like. By subtracting the warpage component map MB obtained in such a manner from the difference value map MA, the residual difference value map MC illustrated in FIG. 5C is obtained. As illustrated in FIG. 5C, the residual difference value MC does not have any gradation, and no pulse beat PB is seen in FIG. 5E, differently from FIG. 5D.

Incidentally, the wafer warpage may be eliminated by holding the wafer flat onto the stage 18 using the suctioning mechanism such as an electrostatic chuck provided in the stage 18. Additionally, the same map as the residual difference value map MC in FIG. 5E may be obtained by eliminating the pulse beat PB in FIG. 5D using a curve-fitting method.

Figure 6A:
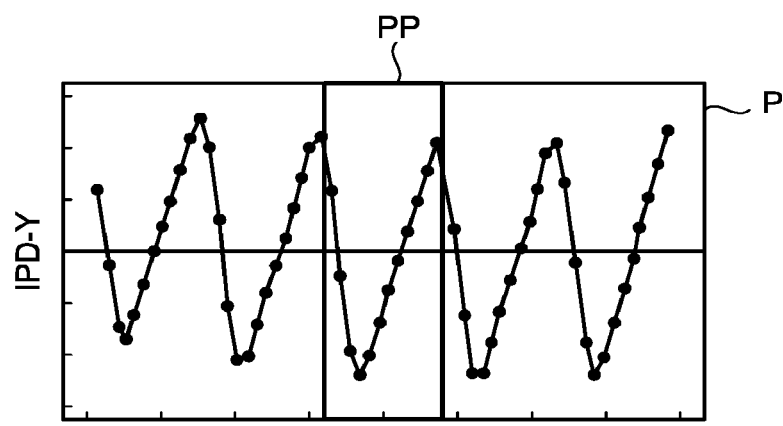
FIGS. 6A and 6B are enlarged views illustrating parts of FIG. 5E.
Figure 6B:
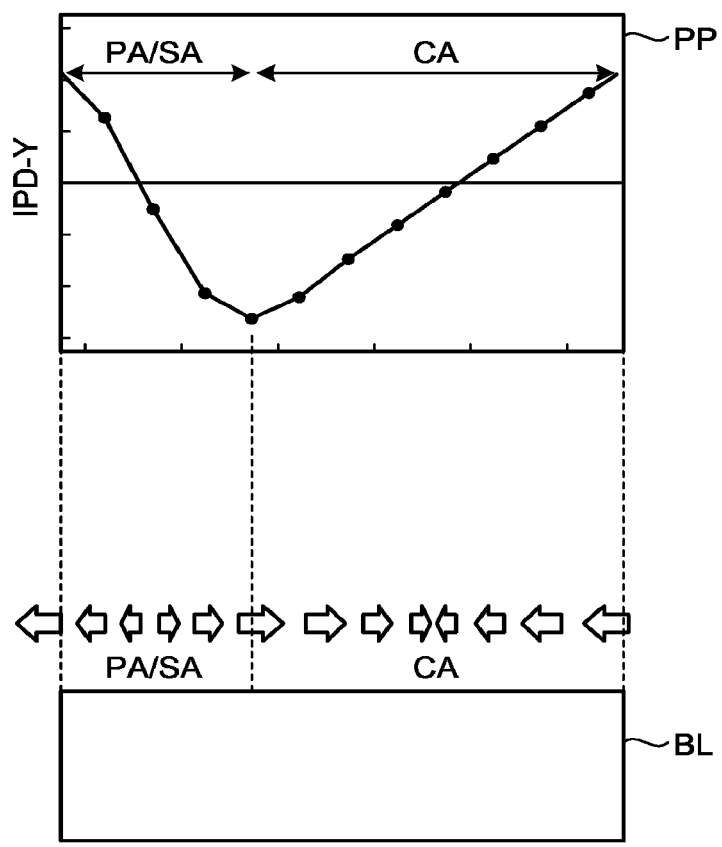

Additional explanation is made referring to FIGS. 6A and 6B. FIG. 6A is a graph illustrating a part P within the FIG. 5E in enlarged representation, and FIG. 6B is a graph illustrating a part PP within FIG. 6A in further enlarged representation. In these graphs, a horizontal axis represents a position along the y direction within the shot region SH, and a vertical axis represents the residual difference value along the y direction. Incidentally, the y direction in the graphs in FIGS. 6A and 6B corresponds to the longitudinal direction of the shot region SH illustrated in FIG. 4.

As illustrated in FIG. 6A, the residual difference value varies periodically in the form of saw-tooth along the y-axis. FIG. 6B, which is an enlarged representation of the part PP within FIG. A, illustrates the residual difference value within the chip region RP. As illustrated, the residual difference value varies in V shape. Here, the residual difference value has a negative inclination in the peripheral area PA and the S/A area SA, and a positive inclination in the cell area CA. These indicate that a tensile stress is applied in the peripheral area PA and the S/A area SA, and a compression stress is applied in the cell area CA. Such stresses are thought to be generated by difference in thermal expansion coefficients between the circuit pattern formed on the upper surface of the wafer W, the circuit pattern being formed through processes such as etching, cleaning, and film-deposition, (or the circuit pattern added to the wafer W from one photolithography process through the next photolithography process) and the underlying layer. Additionally, the stresses may be increased because structures are different in the cell area CA, where the stacked body is formed, from the peripheral area PA and the S/A area SA, where no stacked body is formed, in this embodiment as described above.

Additionally, the cell area CA is contracted by such a compressive stress, and the peripheral area PA and the S/A area SA are expanded by the tensile stress. Namely, such expansion and contraction cause positional deviation in the cell area CA with respect to a light-blocking pattern of the corresponding cell area of the reticle 12 used, when a photoresist film is exposed in the next Step S16, for example.

Incidentally, while FIG. 5D and FIG. 5E indicate the difference values with respect to the y-axis, the difference values with respect to the x-axis may be obtained in a similar manner. The x-axis corresponds to the widthwise direction of the shot region SH in FIG. 4.

Referring back to FIG. 3, at Step S14, based on both the differential position information (an amount of positional deviation) calculated at Step S13 and the third position information acquired by the position detection apparatus 14 at Step S11, a position correction amount is determined.

When an x-y coordinates is set on the surface (the shot region SH) of the wafer W, a positional deviation amount $IPDX(x, y)$ in the x-axis directions and a positional deviation amount $IPDY(x, y)$ in the y-axis directions in each coordinate point $(x, y)$ are expressed as the following Equation (1):

$$IPDX(x, y) = k_1 + k_3 x + k_5 y \brace IPDY(x, y) = k_2 + k_4 x + k_6 y \quad (1)$$

Here, $k_1$, $k_2$, $k_3$, $k_4$, $k_5$, and $k_6$ are correction parameters and expressed as Equation (2):

$$\left. \begin{array}{ll} k_1 = \sum_{m,n=0}^{m,n} P_{1mn} X^m Y^n + \alpha_1 & k_2 = \sum_{m,n=0}^{m,n} P_{2mn} X^m Y^n + \alpha_2 \\ k_3 = \sum_{m,n=0}^{m,n} P_{3mn} X^m Y^n + \alpha_3 & k_4 = \sum_{m,n=0}^{m,n} P_{4mn} X^m Y^n + \alpha_4 \\ k_5 = \sum_{m,n=0}^{m,n} P_{5mn} X^m Y^n + \alpha_5 & k_6 = \sum_{m,n=0}^{m,n} P_{6mn} X^m Y^n + \alpha_6 \end{array} \right\} \quad (2)$$

As above, Equation (2) is a function of an in-plane coordinate point $(x, y)$ of the wafer W, wherein m, n is an integer greater than zero. $P_{1mn}$-$P_{6mn}$ may be said to be substantive correction parameters.

Additionally, as illustrated in FIG. 7A, $k_1$ indicates a shift component in the x directions; $k_3$ is a magnification component in the x directions; and $k_5$ indicates a rotational component in the x directions (or an orthogonal component in the x directions). Similarly, as illustrated in FIG. 7B, $k_2$ indicates a shift component in the y directions; $k_4$ is a magnification component in the y directions; and $k_6$ indicates a rotational component in the y directions (or an orthogonal component in the x directions). By changing these correction parameters $k_1$ through $k_6$, a relative velocity between the stage 18 and the reticle 12, a rotational angle of the stage 18, a magnification of projected light determined by the lens system 10B, or the like may be corrected. Incidentally, the positional deviations caused by the expansion and contraction generated in the chip region RP as described above may be corrected based on the correction parameters $k_3$ and $k_4$.

In the following, explanation is made taking $IPDX(x, y)$ in Equation (1) as an example. First, a vector (an objective variable vector) η having calculated values $IPDx_1$, $IPDx_2$, ..., $IPDx_N$ of positional deviation amounts at corresponding points $x_1, x_2, \ldots, x_N$ in the x-axis direction as elements are expressed as Equation (3):

$$\eta = \begin{pmatrix} IPDx_1 \\ IPDx_2 \\ \vdots \\ IPDx_N \end{pmatrix} \quad (3)$$

Additionally, a vector H having theoretical values of objective variables as elements are similarly expressed as Equation (4):

$$H = \begin{pmatrix} \widetilde{IPD}x_1 \\ \widetilde{IPD}x_2 \\ \vdots \\ \widetilde{IPD}x_N \end{pmatrix} \quad (4)$$

Moreover, assuming that an explanatory variable vector F is a vector where "1" is added to each coordinate points $(x, y)$, (see Equation (5)), and that a vector β is a vector having the correction parameters $k_1$, $k_2$, $k_5$ as elements (Equation (6)).

$$F = \begin{pmatrix} X_1 & Y_1 & 1 \\ X_2 & Y_2 & 1 \\ \vdots & \vdots & \vdots \\ X_N & Y_N & 1 \end{pmatrix} \quad (5)$$

$$\beta = \begin{pmatrix} k_1 \\ k_3 \\ k_5 \end{pmatrix} \quad (6)$$

Because the vector H can be expressed by a product of the vector β having the correction parameters $k_1$, $k_2$, $k_5$ as elements and the explanatory variable vector F, the following Equation (7) is established.

$$H = \begin{pmatrix} I\widehat{PD}x_1 \\ I\widehat{PD}x_2 \\ \vdots \\ I\widehat{PD}x_N \end{pmatrix} = F\beta = \begin{pmatrix} X_1 & Y_1 & 1 \\ X_2 & Y_2 & 1 \\ \vdots & \vdots & \vdots \\ X_N & Y_N & 1 \end{pmatrix} \begin{pmatrix} k_1 \\ k_3 \\ k_5 \end{pmatrix} = \begin{pmatrix} k_1 X_1 + k_3 Y_1 + k_5 \\ k_1 X_2 + k_3 Y_2 + k_5 \\ \vdots \\ k_1 X_N + k_3 Y_N + k_5 \end{pmatrix} \quad (7)$$

Here, assuming that a vector D is a vector of which elements are residual errors between N elements of the vector H having the theoretical values of objective variables as elements and corresponding elements of the vector η having calculated values as elements, Equation (8) is established.

$$\eta - H = \eta - F\beta = D \quad (8)$$

When an error sum of squares is assumed to be S, a sum of squares is expressed as Equation (9) because the sum of squares is expressed by a product of the vector D and a transposed vector $^tD$.

$$S = {}^t DD \quad (9)$$

Then, the sum of squares S is differentiated with respect to the vector β, and when it is assumed, as a condition that makes the sum of squares the minimum, that a result of this differentiating is equal to a zero vector, the following Equation (10) is obtained.

$$\frac{\partial S}{\partial \beta} = -2{}^tF\eta + 2{}^tFF\beta = 0 \quad (10)$$

Therefore, Equation (11) below is established.

$${}^tFF\beta = {}^tF\eta \quad (11)$$

Then, from the following Equation (12), the vector β, namely, the correction parameters $k_1$, $k_3$, $k_5$ are obtained.

$$\beta = ({}^tFF)^{t}F\eta (\det{}^tFF \approx 0) \quad (12)$$

When the same calculation is performed for the y-axis directions, the correction parameters $k_2$, $k_4$, $k_6$ are obtained. With this, the positional deviation amounts IPDX (x, y) and IPDY (x, y) in Equation (1) are acquired. Subsequently, based on the third position information acquired by the position detection apparatus 14, and the positional deviation amounts, the position correction amount is determined. With this, the relative position between the wafer W and the reticle 12 due to the third position information may be corrected.

Next, at Step S15, the position correction amount is transmitted from the control-value output portion 23 of the controller 20 to the image-focusing portion 31, the photomask control portion 32, and the substrate control portion 33. While, based on the position correction amount, the lens system 10B is controlled by the image-focusing portion 31, and/or (a supporting member of) the reticle 12 is controlled by the photomask control portion 32, and/or the stage is controlled by the substrate control portion 33, the photoresist film on the wafer W is exposed (Step S16).

Next, after the photoresist film is exposed, the wafer W is transferred out to the photoresist coater/developer, where the photoresist film that has been exposed is developed (Step S17). With this, a predetermined photoresist mask is formed on the upper surface of the wafer W.

Processes such as etching using the photoresist mask, cleaning, film deposition are performed on the wafer W having the photoresist mask thereon (Step S18). With this, a series of processes including the exposure method according to this embodiment is completed.

As described above, in the exposure method according to this embodiment, prior to the first exposure process (Step S6), the height information (the first height information) acquired about the upper surface of the wafer W by the height detection apparatus 16 is converted into the position information (the second position information). This position information (the second position information) is stored to be used later. Then, the wafer W undergoes various processes, and returns to the second exposure process (Step S16). Prior to the second exposure process, the height information (the second height information) is acquired about the upper surface of the wafer W (that has undergone various processes). Similarly as in the first exposure process, this height information (the second height information) is converted into the position information (the fourth position information). Next, the position difference information is calculated between the fourth position information and the second position information, which is stored in advance. Based on the position difference information and the position information (the third position information) acquired by the position detection apparatus 14, the position correction amount is determined. Then, the lens system 10B, the reticle 12, and/or the stage (FIG. 1) are controlled in accordance with the determined position correction amount, and thus the photoresist film on the wafer W is exposed.

As explained, according to the exposure method of this embodiment, not only the position information acquired by the position detection apparatus 14 but also the position information converted from the height information acquired by the height detection apparatus 16 is used to correct the relative position between the reticle 12 and the wafer W. With this, positioning accuracy may be improved.

Additionally, the height detection apparatus 16 can have a focus area of about 0.1 to 1 mm by 0.1 to 1 mm. Here, a length of the cell area SA along the y direction is, for example, several millimeters; a length of the peripheral area PA along the y direction is, for example, about 1/10 to 1/2 of the length of the cell area CA along the y direction. If a height detection apparatus is used which has a focus area comparable to the size of the cell area CA and the peripheral area PA, it becomes difficult to capture only the peripheral area PA within the focus area. Namely, both the cell area CA and the peripheral area PA are included in such a focus area, which may cause errors in the measured height.

However, because the height detection apparatus 16 of the exposure apparatus 1 according to this embodiment has a focus area of, for example, about 0.1 to 1 mm by 0.1 to 1 mm as described above, heights in the cell area CA and the peripheral area PA can be independently measured. Namely, the heights can be detected at relatively higher accuracy.

Additionally, the position information converted from such highly accurate height information can also have a high accuracy. Therefore, the positional deviation that may be caused in a minute area such as the shot region SH, the chip region RP, or the like by the stress can be detected, and thus such positional deviation may be corrected.

Modification

Next, referring to FIG. 8, explanation is made on modification of the exposure method according to the embodiment. FIG. 8 is a flowchart illustrating the modification of the exposure method according to the embodiment. The modified exposure method may be performed on a wafer that undergoes no process (namely, a bare wafer) or a wafer that has undergone several early stage processes.

At Step S21, the above-mentioned wafer W is transferred into a photoresist coater/developer provided outside of the exposure apparatus 1, where a photoresist film is applied onto the wafer W. Next, at Step S22, the wafer W having the photoresist film thereon is transferred from the photoresist coater/developer to the exposure apparatus 1. The wafer W is held on the upper surface of the stage 18 within the exposure apparatus 1.

At Step S23, the wafer W is scanned in the x-y plane by movement of the stage 18. During this scanning, a height with respect to a predetermined reference surface (for example, the upper surface of the base layer of the wafer W) is detected through the photoresist film at each coordinate point (x, y) on the upper surface of the wafer W by the height detection apparatus 16. Based on the detection result, height information is acquired. The height information may be, for example, data that associate each coordinate point with a height therein. The height information is transmitted to the measurement data input portion 21 (FIG. 1) of the controller 20 from the height detection apparatus 16.

Additionally, at Step S23, the alignment mark (not illustrated) of the reticle 12 and the alignment mark (not illustrated) of the wafer W are detected by the position detection apparatus 14, and the first position information is acquired based on the detection result. The first position information is transmitted to the measurement data input portion 21 (FIG. 1) of the controller 20 from the position detection apparatus 14.

Next, at Step S24, the measurement data processing portion 22 converts the height information to the second position information. This conversion may also be performed by differentiating a height function to x with respect to the x-axis and a height function to y with respect to the y-axis.

Then, at Step S25, the measurement data processing 22 determines positional correction amount, based on the first position information acquired by the position detection apparatus 14 and the height information acquired by the height detection apparatus 16.

At Step S26, the position correction amount is transmitted from the control-value output portion 23 to the image-focusing portion 31, the photomask control portion 32, and the substrate control portion 33. Then, at Step S27, the photoresist film on the wafer W is exposed while the lens system 10B is controlled by the image-focusing portion 31, the (supporting portion) of the reticle 12 is controlled by the photomask control portion 32, and the stage 18 is controlled by the substrate control portion 33, based on the position correction amount. After this, the wafer W is transferred out to the photoresist coater/developer from the exposure apparatus 1, where the photoresist film is developed (Step S28).

In the exposure method according to the modification, the position correction amount is determined based on the first position information acquired by the position detection apparatus 14 and the second position information into which the height information acquired by the height detection apparatus 16 is converted. Then, the photoresist film is exposed based the position correction amount. Because the position correction amount is determined by applying the second position information obtained by converting the height information to the first position information acquired by the position detection apparatus 14, accuracy of the position alignment may be improved.

Incidentally, in the exposure method according to the embodiment, after Step S4 (FIG. 2), at the same time when the second position information is stored or after the second information is stored at Step S5, the position correction amount may be determined based on the first position information and the second position information, in the similar manner as the modification of the embodiment.

Additionally, the exposure method according to the embodiment (including the modification) may be used as a semiconductor manufacturing method for manufacturing various semiconductor devices including a semiconductor storage device.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. An exposure method comprising:
    acquiring first height information through detection of a height of an upper surface of a substrate subjected to exposure;
    acquiring first position information through detection of a relative position between the substrate and a first mask having a first pattern to be transferred on the substrate;
    converting the first height information to second position information;
    acquiring second height information through detection of a height of the upper surface of the substrate;
    acquiring third position information through detection of a relative position between the substrate and a second mask having a second pattern to be transferred on the substrate;
    converting the second height information to fourth position information;
    calculating differential position information, based on difference between the second position information and the fourth position information; and
    aligning the second mask and the substrate, based on the third position information and the differential position information.

2. The exposure method according to claim 1, further comprising
    aligning the substrate and the first mask, based on the first position information and the first height information; and
    transferring on the substrate the first pattern to be transferred.

3. The exposure method according to claim 1, further comprising
aligning the substrate and the first mask, based on the first position information and the second position information; and
transferring on the substrate the first pattern to be transferred.

4. The exposure method according to claim 1,
wherein the first mask and the second mask have an equal-sized shot region or chip region, and
wherein the first and second position information are acquired in the shot region or the chip region.

5. The exposure method according to claim 1, wherein the conversion from the first height information to the second position information is performed by differentiating the first height information with respect to a predetermined positional coordinate.

6. The exposure method according to claim 1, wherein the conversion from the second height information to the fourth position information is performed by differentiating the second height information with respect to a predetermined positional coordinate.

7. An exposure apparatus comprising:
a height detector configured to detect a height of an upper surface of a substrate subjected to exposure, and acquire height information;
a position detector configured to detect a relative position between the substrate and a mask having a pattern to be transferred on the substrate, and acquire position information;
an optical system configured to transfer on the substrate the pattern to be transferred; and
a controller configured to control the height detector, the position detector, and the optical system,
wherein
the controller is configured to:
acquire first height information through detection of a height of the upper surface of the substrate subjected to exposure;
acquire first position information through detection of a relative position between the substrate and a first mask having a first pattern to be transferred on the substrate;
convert the first height information to second position information;
acquire second height information through detection of a height of the upper surface of the substrate;
acquire third position information through detection of a relative position between the substrate and a second mask having a second pattern to be transferred on the substrate;
convert the second height information to fourth position information;
calculate differential position information, based on difference between the second position information and the fourth position information; and
align the second mask and the substrate, based on the third position information and the differential position information.

8. The exposure apparatus according to claim 7, wherein the controller is further configured to
align the substrate and the first mask, based on the first position information and the first height information; and
transfer on the substrate the first pattern to be transferred.

9. The exposure apparatus according to claim 7, wherein the controller is further configured to
align the substrate and the first mask, based on the first position information and the second position information; and
transfer on the substrate the first pattern to be transferred.

10. The exposure apparatus according to claim 7,
wherein the first mask and the second mask have an equal-sized shot region or chip region, and
wherein the first and second position information are acquired in the shot region or the chip region.

11. The exposure apparatus according to claim 7, wherein the controller is further configured to convert the first height information to the second position information by differentiating the first height information with respect to a predetermined positional coordinate.

12. The exposure apparatus according to claim 7, wherein the controller is further configured to convert the second height information to the fourth position information by differentiating the second height information with respect to a predetermined positional coordinate.

13. A semiconductor device manufacturing method comprising:
acquiring first height information through detection of a height of an upper surface of a substrate subjected to exposure;
acquiring first position information through detection of a relative position between the substrate and a first mask having a first pattern to be transferred on the substrate;
converting the first height information to second position information;
acquiring second height information through detection of a height of the upper surface of the substrate;
acquiring third position information through detection of a relative position between the substrate and a second mask having a second pattern to be transferred on the substrate;
converting the second height information to fourth position information;
calculating differential position information, based on difference between the second position information and the fourth position information; and
aligning the second mask and the substrate, based on the third position information and the differential position information.

14. The semiconductor device manufacturing method according to claim 13, further comprising
aligning the substrate and the first mask, based on the first position information and the first height information;
transferring the first pattern on the substrate; and
forming a circuit pattern by performing on the substrate at least one of an etching process, a cleaning process, or a film deposition process.

15. The semiconductor device manufacturing method according to claim 13, further comprising
aligning the substrate and the first mask, based on the first position information and the second position information;
transferring the first pattern on the substrate; and
forming a circuit pattern by performing on the substrate at least one of an etching process, a cleaning process, or a film deposition process.

16. The semiconductor device manufacturing method according to claim 13,
wherein the first mask and the second mask have an equal-sized shot region or chip region, and
wherein the first and second position information are acquired in the shot region or the chip region.

17. The semiconductor device manufacturing method according to claim 13, wherein the conversion from the first height information to the second position information is performed by differentiating the first height information with respect to a predetermined positional coordinate.

18. The semiconductor device manufacturing method according to claim 13, wherein the conversion from the second height information to the fourth position information is performed by differentiating the second height information with respect to a predetermined positional coordinate.

* * * * *